(12) United States Patent
Seki et al.

(10) Patent No.: US 10,415,862 B2
(45) Date of Patent: Sep. 17, 2019

(54) CHILLER APPARATUS FOR PLASMA TREATMENT DEVICE

(71) Applicant: SHINWA CONTROLS CO., LTD., Kawasaki-shi, Kanagawa (JP)

(72) Inventors: Atsushi Seki, Kawasaki (JP); Seiichiro Sakai, Kawasaki (JP)

(73) Assignee: SHINWA CONTROLS CO., LTD, Kawasaki-shi (JP)

( * ) Notice: Subject to any disclaimer, the term of this patent is extended or adjusted under 35 U.S.C. 154(b) by 69 days.

(21) Appl. No.: 15/314,203

(22) PCT Filed: Jun. 9, 2016

(86) PCT No.: PCT/JP2016/067293
§ 371 (c)(1),
(2) Date: Nov. 28, 2016

(87) PCT Pub. No.: WO2016/204076
PCT Pub. Date: Dec. 22, 2016

(65) Prior Publication Data
US 2018/0038620 A1    Feb. 8, 2018

(30) Foreign Application Priority Data

Jun. 15, 2015  (JP) ................................. 2015-120572

(51) Int. Cl.
*C23C 14/54*   (2006.01)
*C23C 16/44*   (2006.01)
(Continued)

(52) U.S. Cl.
CPC .............. *F25B 49/02* (2013.01); *C23C 14/24* (2013.01); *C23C 14/541* (2013.01);
(Continued)

(58) Field of Classification Search
CPC .............. C23C 14/24; H01J 2237/2001; H01J 2237/3344; H01J 37/32724;
(Continued)

(56) References Cited

U.S. PATENT DOCUMENTS 6,135,052 A * 10/2000 Fujii ...................... H01H 73/14
                                                        118/723 E
6,258,218 B1 * 7/2001 Burton .................. C23C 14/205
                                                        204/192.12
(Continued)

FOREIGN PATENT DOCUMENTS

CN         1505112 A     6/2004
EP         3112774 A1    1/2017
(Continued)

OTHER PUBLICATIONS

Feb. 15, 2018 Search Report issued in European Patent Application No. 16797713.1.

*Primary Examiner* — Henry T Crenshaw
(74) *Attorney, Agent, or Firm* — Oliff PLC

(57) ABSTRACT

In the present chiller apparatus, a refrigerant flow path is branchably attached to a lower electrode serving as a large sample table, which copes with a case where the surface area of a sample is large in a configuration in which a plasma treatment device connected to a refrigerant cycle equipped with a heating device is applied. A control device transmits a heating adjustment control signal generated based on a result of a PID arithmetic operation including proportion, integration, and differentiation on a lower electrode refrigerant pipe refrigerant detection temperature detected from a temperature sensor provided in the vicinity of a refrigerant flow path of a heat insulating portion relative to the lower electrode of a lower electrode refrigerant pipe connected to be linked to the refrigerant cycle to a heating device and
(Continued)

performs feedback control such that the lower electrode refrigerant pipe refrigerant detection temperature becomes a setting temperature.

4 Claims, 4 Drawing Sheets

(51) Int. Cl.
| | |
|---|---|
| *C23C 16/46* | (2006.01) |
| *F25B 1/00* | (2006.01) |
| *H01L 21/3065* | (2006.01) |
| *C23C 14/24* | (2006.01) |
| *F25B 39/00* | (2006.01) |
| *H01J 37/32* | (2006.01) |
| *H01L 21/67* | (2006.01) |
| *F25B 49/02* | (2006.01) |
| *F25B 39/02* | (2006.01) |

(52) U.S. Cl.
CPC ........ *C23C 16/4411* (2013.01); *C23C 16/463* (2013.01); *F25B 1/00* (2013.01); *F25B 39/00* (2013.01); *H01J 37/3299* (2013.01); *H01J 37/32522* (2013.01); *H01J 37/32724* (2013.01); *H01J 37/32935* (2013.01); *H01L 21/3065* (2013.01); *H01L 21/67069* (2013.01); *H01L 21/67109* (2013.01); *H01L 21/67248* (2013.01); *F25B 39/024* (2013.01); *F25B 2400/01* (2013.01); *F25B 2600/0253* (2013.01); *F25B 2700/2117* (2013.01); *F25B 2700/21151* (2013.01); *F25B 2700/21152* (2013.01); *H01J 2237/2001* (2013.01); *H01J 2237/3344* (2013.01)

(58) Field of Classification Search
CPC ......... H01L 21/67069; H01L 21/67109; H01L 21/06; F25B 2400/01; F25B 2600/0253; F25B 2700/21151; F25B 2700/21152; F25B 2700/2117; F25B 39/00; F25B 39/024; F25B 49/02

USPC .......................................................... 62/203
See application file for complete search history.

(56) References Cited

U.S. PATENT DOCUMENTS

| | | | | |
|---|---|---|---|---|
| 7,000,412 | B2* | 2/2006 | Huang | F25D 17/02 165/201 |
| 2003/0010453 | A1* | 1/2003 | Tanaka | H01J 37/32082 156/345.38 |
| 2003/0159456 | A1* | 8/2003 | Cowans | B23Q 11/141 62/259.1 |
| 2006/0283549 | A1* | 12/2006 | Aramaki | H01J 37/32091 156/345.28 |
| 2008/0156031 | A1* | 7/2008 | Cur | F25B 25/00 62/203 |
| 2008/0271471 | A1* | 11/2008 | Nozawa | C23C 16/4411 62/179 |
| 2009/0119832 | A1* | 5/2009 | Conroy | E03C 1/05 4/623 |
| 2011/0011476 | A1* | 1/2011 | Brondum | F16K 11/0655 137/801 |
| 2011/0088799 | A1* | 4/2011 | Jung | E03C 1/055 137/607 |
| 2012/0297804 | A1* | 11/2012 | Yamashita | F25B 13/00 62/207 |
| 2013/0174601 | A1* | 7/2013 | Matsuo | F04D 27/001 62/498 |
| 2013/0240144 | A1 | 9/2013 | Buchberger et al. | |

FOREIGN PATENT DOCUMENTS

| | | |
|---|---|---|
| JP | H05-243191 A | 9/1993 |
| JP | H07-245297 A | 9/1995 |
| JP | 2001-044176 A | 2/2001 |
| JP | 2003-150204 A | 5/2003 |
| JP | 2008-075919 A | 4/2008 |
| JP | 2008-075920 A | 4/2008 |
| JP | 2011-119515 A | 6/2011 |
| JP | 2014-063972 A | 4/2014 |
| JP | 5721875 B1 | 5/2015 |
| WO | 2008/039611 A2 | 4/2008 |

* cited by examiner

CHILLER APPARATUS FOR PLASMA TREATMENT DEVICE

TECHNICAL FIELD

The present invention relates to a chiller apparatus which shares an evaporator as a heat exchanger between a refrigerating cycle for cooling and a refrigerant cycle including a heating device for heating and has a function of controlling a rotational speed of an electric compressor of the refrigerating cycle, a refrigerant flow rate by a pump linked to a refrigerant tank in the refrigerant cycle, and a heating temperature of the heating device by a control device according to a temperature difference between a setting temperature set by a user and a work temperature of a work (customer device) connected to the refrigerant cycle to heat-insulate the work, and particularly to a chiller apparatus for a plasma treatment device, which applies the plasma treatment device that performs plasma treatment for etching a sample to be target to a work.

BACKGROUND ART

A general chiller apparatus conventionally has a circuit configuration in which a refrigerant is circulated in each pipe by a refrigerating cycle for cooling and a refrigerant cycle for heating, and a work as a load to be heat-insulated at a local part of the refrigerant cycle is interposed and connected. The refrigerating cycle serves as a primary temperature adjustment circuit of a circuit configuration in which an electric compressor compresses a refrigerant gas and feeds it to a condenser on the delivery side as a high pressure gas, the condenser condenses the high pressure gas and reduces the same through an expansion valve of a pressure reducing mechanism, followed by being fed to an evaporator, and the evaporator evaporates a decompressed refrigerant put in a low-pressure gas-liquid mixed state and allows it to be sucked into the suction side of the compressor, followed by a repetition of the compression again. The refrigerant cycle serves as a secondary temperature adjustment circuit of a circuit configuration in which the evaporator of the refrigerating cycle is used in common and refrigerant liquid put in a low-pressure liquid state is recovered by and stored in a refrigerant tank, and the refrigerant liquid appropriately heated by a heating device (heater) mounted to the refrigerant tank is returned to the evaporator with the work intervened.

A rotational speed of the compressor equipped in the refrigerating cycle hereat and a heating temperature of the heating device equipped in the refrigerant cycle, and a refrigerant flow rate by a pump linked to the refrigerant tank are controlled by a control device provided for use of a selective temperature setting in a predetermined temperature range (−20° C. to 60° C., for example) for a user according to a temperature difference between a setting temperature and a work temperature. The refrigerating cycle and the refrigerant cycle are respectively provided with temperature sensors, and the work temperature is detected from the temperature sensor provided at a spot on the work side more than the pump of the refrigerant cycle.

The control device performs control of operation modes different according to a temperature difference between an initial setting temperature and a work temperature. Since a cooling function of the refrigerating cycle is not required upon a high temperature setting in which there occurs a temperature difference (exceeding 10° C., for example) at which the setting temperature is much higher than the work temperature, for example, an operation mode of suppressing low the rotational speed of the compressor, setting high the heating temperature of the heating device of the refrigerant cycle, and giving priority to a heating function so as to eliminate the temperature difference is executed. Also, since a heating function by the heating device of the refrigerant cycle is not required upon a low temperature setting in which there occurs a temperature difference (exceeding 10° C., for example) at which the setting temperature is much lower than the work temperature, an operation mode of setting high the rotational speed of the compressor of the refrigerating cycle without performing the heating setting of the heating device and giving priority to a cooling function so as to eliminate the temperature difference is performed. Further, upon a heat insulting setting (including where the operation mode of giving priority to the above-described heating function or the operation mode of giving priority to the cooling function is continuously performed to reduce the temperature difference or where no temperature difference occurs initially in advance) in which the temperature difference (5° C. to 10° C., for example) at which the setting temperature is close to the work temperature, an operation mode of executing both of the heating function by the heating device and the cooling function of the refrigerating cycle, specifically, changing the rotational speed of the compressor slightly increasingly or decreasingly from a prescribed value so as to eliminate the temperature difference, or changing the heat to be applied by the heating device slightly increasingly or decreasingly from a prescribed value to carry out both the heating function and the cooling function is performed.

Incidentally, as well-known arts each related to the heat insulating function to the work in such a chiller apparatus, there can be mentioned, for example, a "chiller apparatus" (refer to Patent Literature 1) which can be stably operated over a wide temperature range and is capable of controlling the temperature of a coolant with good accuracy, a "chiller apparatus" (refer to Patent Literature 2) which does not require a large-sized heater and is capable of controlling the temperature of a coolant with good accuracy, etc.

CITATION LIST

Patent Literature

PATENT LITERATURE 1: JP-A No. 2008-75919
PATENT LITERATURE 2: JP-A No. 2008-75920

SUMMARY OF INVENTION

Technical Problem

Meanwhile, the heat insulating function to the work in the above-described well-known chiller apparatus has been examined in terms of its application in various fields. For example, the heat insulating function can also be adapted to a specification (specification of 80° C. or so, for example) that the heating function in the heating device of the refrigerant cycle is enhanced to raise a heat insulation upper limit temperature. In such a case, the work is configured as a semiconductor manufacturing apparatus and can be applied to a semiconductor etching process.

Described specifically, it is assumed that as one example of a semiconductor manufacturing apparatus, it is applied to a plasma treatment device which performs plasma treatment in order to etch a semiconductor wafer as a sample to be a target in a semiconductor etching process. In such a case, there can be illustrated a case where a refrigerant pipe is attached to a lower electrode sharing a sample table and connected to be linked to a refrigerant cycle, and on the basis of a result obtained by detecting a refrigerant temperature on the refrigerant delivery side from the plasma treatment device by a temperature sensor, a control device is adapted to a specification in which it performs feedback control on the degree of heating in a heating device, based on a refrigerant return temperature in a temperature zone of −20° C. to 80° C., and performs feedforward control in such a manner that thermal load information indicated by the degree of heating is reflected onto control of a rotational speed of an electric compressor in a refrigerating cycle and control of a refrigerant flow rate by a pump linked to a refrigerant tank in the refrigerant cycle to detect a command value and disturbance inputted to a control system and cancel the influence thereof.

The chiller apparatus for the plasma treatment device having such a specification can be constructed by applying the technologies described in the Patent Literature 1 and the Patent Literature 2 described above. However, when the sample is not so large in surface area as in the case of a general semiconductor wafer, the lower electrode which shares the sample table may also be a size nearly the same as that. Therefore, the length of a lower electrode refrigerant pipe attached to the lower electrode in the plasma treatment device with a refrigerant put therein and connected so as to be linked to the refrigerant cycle is also relatively short, and a work temperature detected as a refrigerant temperature on the refrigerant delivery side of the plasma treatment device without so much delay of the transfer of a fluctuation in thermal load even if a fluctuation in temperature due to the thermal load occurs by the influence of plasma treatment is obtained with relatively high accuracy. Thus, heat insulation control of the lower electrode is performed with good accuracy by carrying out the feedback control and the feedforward control by means of the control device, and the etching can be done with good accuracy by substantially uniformly generating plasma by the heat insulation control of the lower electrode.

A problem however arises in that when the sample is large in surface area as in the case where it is, for example, a flat panel display (FPD) of a glass substrate system, and the lower electrode which serves as the sample table is also large-sized, the length of the lower electrode refrigerant pipe attached to the lower electrode in the plasma treatment device with the refrigerant put therein and connected so as to be linked to the refrigerant cycle is considerably long, and the work temperature detected as the refrigerant temperature on the refrigerant delivery side of the plasma treatment device with a delay in the transfer of the fluctuation in thermal load when the fluctuation in temperature due to the thermal load occurs by the influence of plasma treatment becomes hard to obtain with high accuracy, so that the heat insulation control of the lower electrode is not performed with good accuracy even though the feedback control and the feedforward control are done by the control device, thus resulting in that nonuniformity occurs in the generation of plasma to make unable to etch the sample with required accuracy.

The present invention has been made to solve such a problem. A technical object thereof is to provide a chiller apparatus for a plasma treatment device, which is capable of even though the surface area of a sample to be a target in the plasma treatment device as a work is large, and a lower electrode sharing a sample table is large-sized, performing heat insulation control with good accuracy and etching the sample with required accuracy without nonuniformity.

Solution to Problem

In order to attain the above technical object, one basic configuration of the present invention is of a chiller apparatus for a plasma treatment device, wherein it shares an evaporator as a heat exchanger between a refrigerating cycle for cooling and a refrigerant cycle including a heating device for heating and has a function of controlling a rotational speed of an electric compressor of the corresponding refrigerating cycle, a refrigerant flow rate by a pump linked to a refrigerant tank in the corresponding refrigerant cycle, and a heating temperature of the corresponding heating device by a control device according to a temperature difference between a setting temperature set by a user and a work temperature of a work connected to the corresponding refrigerant cycle to heat-insulate the work, and applies the plasma treatment device which performs plasma treatment to the corresponding work to etch a sample to be a target, and in that the plasma treatment device is equipped within a vacuum chamber with a lower electrode which places the corresponding sample thereon, serving as a large-size sample table coping with a case in which a surface area of the sample is large; a lower electrode refrigerant pipe which is attached to a surface of the lower electrode on a side opposite to a side of placement of the sample so as to allow a refrigerant flow path to be branched and which is connected to be linked to the refrigerant cycle inclusive of a heat insulating portion heat-insulating the corresponding lower electrode; and a refrigerant temperature sensor for the lower electrode refrigerant pipe, which is provided in the vicinity of the refrigerant flow path of the heat insulating portion of the lower electrode refrigerant pipe and outputs a result of detection of a refrigerant temperature of the corresponding lower electrode refrigerant pipe as a lower electrode refrigerant pipe refrigerant detection temperature indicative of the work temperature, and besides is equipped with an upper electrode arranged within the vacuum chamber in opposition to the lower electrode and having a lid part in an integral manner; an upper electrode refrigerant pipe attached to the upper electrode and connected so as to be linked to the refrigerant cycle inclusive of a heat insulating portion heat-insulating the corresponding upper electrode; a vacuum chamber refrigerant pipe attached to a wall of the vacuum chamber and connected so as to be linked to the refrigerant cycle, and including a heat insulating portion heat-insulating the wall of the corresponding vacuum chamber; a refrigerant temperature sensor for the upper electrode refrigerant pipe, which is provided in the vicinity of a refrigerant flow path of the heat insulating portion of the upper electrode refrigerant pipe and outputs a result of detection of a refrigerant temperature of the corresponding upper electrode refrigerant pipe as an upper electrode refrigerant pipe refrigerant detection temperature indicative of the work temperature; and a refrigerant temperature sensor for the vacuum chamber refrigerant pipe, which is provided in the vicinity of a refrigerant flow path of the heat insulating portion of the vacuum chamber refrigerant pipe and outputs a result of detection of a refrigerant temperature of the corresponding vacuum chamber refrigerant pipe as a vacuum chamber refrigerant pipe refrigerant detection temperature indicative of the work temperature; the refrigerant cycle is equipped with a work suction-side temperature sensor which is provided on the refrigerant suction side in the plasma treatment device and outputs a result of detection of a refrigerant return temperature as a refrigerant return detection temperature, and a work delivery-side temperature sensor which is provided on the refrigerant delivery side in the plasma treatment device and outputs a result of detection of a refrigerant delivery temperature as a refrigerant delivery detection temperature; and the control device transmits a heating adjustment control signal for adjusting and controlling the degree of heating of the heating device, which is generated based on a result of a PID arithmetic operation including proportion, integration, and differentiation on the lower electrode refrigerant pipe refrigerant detection temperature detected by the refrigerant temperature sensor for the lower electrode refrigerant pipe to the corresponding heating device to perform first feedback control such that the lower electrode refrigerant pipe refrigerant detection temperature becomes the setting temperature, and transmits heating adjustment control signals for adjusting and controlling the degree of heating of the corresponding heating device, which are respectively generated based on a result of a PID arithmetic operation including proportion, integration, and differentiation on the corresponding lower electrode refrigerant pipe refrigerant detection temperature detected by the refrigerant temperature sensor for the lower electrode refrigerant pipe, a result of a PID arithmetic operation including proportion, integration, and differentiation on the upper electrode refrigerant pipe refrigerant detection temperature detected by the refrigerant temperature sensor for the upper electrode refrigerant pipe, and a result of a PID arithmetic operation including proportion, integration, and differentiation on the vacuum chamber refrigerant pipe refrigerant detection temperature detected by the refrigerant temperature sensor for the vacuum chamber refrigerant pipe to the corresponding heating device to perform second feedback control in such a manner that the refrigerant return detection temperature detected by the work suction-side temperature sensor becomes the corresponding setting value, or transmits heating adjustment control signals for adjusting and controlling the degree of heating of the corresponding heating device, which are respectively generated based on a result of a PID arithmetic operation including proportion, integration, and differentiation on the corresponding lower electrode refrigerant pipe refrigerant detection temperature detected by the corresponding refrigerant temperature sensor for the lower electrode refrigerant pipe, a result of a PID arithmetic operation including proportion, integration, and differentiation on the upper electrode refrigerant pipe refrigerant detection temperature detected by the refrigerant temperature sensor for the upper electrode refrigerant pipe, and a result of a PID arithmetic operation including proportion, integration, and differentiation on the vacuum chamber refrigerant pipe refrigerant detection temperature detected by the refrigerant temperature sensor for the vacuum chamber refrigerant pipe to the corresponding heating device to perform third feedback control in such a manner that the refrigerant delivery detection temperature detected by the work delivery-side temperature sensor becomes the corresponding setting value.

Advantageous Effects of Invention

According to the chiller apparatus for the plasma treatment device of the present invention, with the above configuration, even though the sample in the plasma treatment device as the work is large in surface area as in the case where it is a flat panel display (FPD), and the lower electrode which shares a sample table is large-sized, heat insulation control can be done with good accuracy, and the sample can be uniformly etched with required accuracy without non-uniformity. Objects, configurations, and effects other than the above will be revealed from the description of the following embodiment.

DESCRIPTION OF EMBODIMENTS

A chiller apparatus for a plasma treatment device of the present invention will hereinafter be described in detail with reference to the accompanying drawings while taking embodiments.

Figure 1:
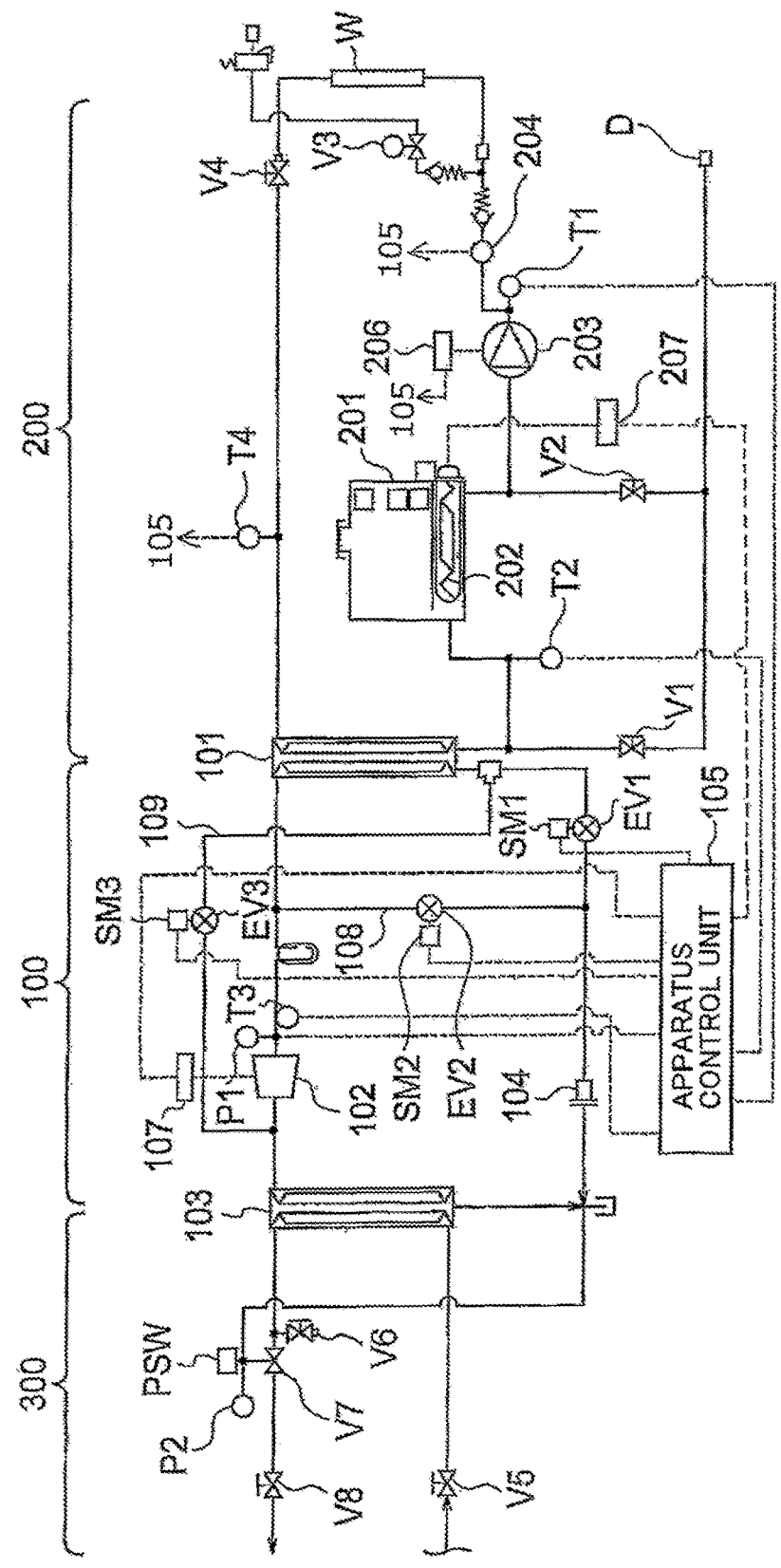
FIG. 1 is an overall schematic diagram showing a basic configuration of a chiller apparatus applicable to a plasma treatment device according to an embodiment of the present invention inclusive of a connection to a work in a refrigerant cycle and a cooling device for a condenser in a refrigerating cycle.

FIG. 1 is an overall schematic diagram showing a basic configuration of a chiller apparatus applicable to a plasma treatment device according to an embodiment of the present invention inclusive of a connection to a work W in a refrigerant cycle 200, and a cooling device 300 for a condenser 103 in a refrigerating cycle 100.

Referring to FIG. 1, this chiller apparatus is the same as conventional in that it has a function for causing a utilizer (user) to selectively set the temperature in a prescribed temperature range (e.g., −20° C. to 130° C.) to thereby heat-insulate various devices to be heat-insulated with the various devices as the work W. Here, the chiller apparatus is equipped with the refrigerating cycle 100 for cooling, the refrigerant cycle 200 for heating sharing an evaporator (heat exchanger) 101 equipped in the refrigerating cycle 100, and a control device based on an apparatus control unit 105 equipped with a CPU, a ROM, a RAM, an IO, etc. which is provided for a selective temperature setting in a prescribed temperature range to the user with various devices (loads) interposed and connected in the refrigerant cycle 200 and to be heat-insulated as the work W, and for controlling a rotational speed of an electric compressor 102 equipped in the refrigerating cycle 100 and a heating temperature at a heating device (heater) 202 for heating with respect to a refrigerant equipped in the refrigerant cycle 200 according to a temperature difference between a setting temperature set by the user through an unillustrated operation part for the user and a work temperature detected by a first temperature sensor T1 provided in a place near the work W side of the refrigerant cycle 200, and has a function of heat-insulating the work W by circulating the refrigerant within pipes by the refrigerating cycle 100 and the refrigerant cycle 200.

Incidentally, although the first temperature sensor T1 for detecting the work temperature hereat is provided on the refrigerant delivery side of a pump 203 sucking the refrigerant from the heating device 202 equipped in the refrigerant cycle 200 and on the refrigerant inflow side near the work W and detects a refrigerant temperature on the refrigerant cycle side and sends the same to the apparatus control unit 105, a refrigerant detection temperature from a fourth temperature sensor T4 provided on the refrigerant suction side of the evaporator 101 and on the refrigerant outflow side near the work W in addition to that is inputted to the apparatus control unit 105, and both results of detection may be used in combination to detect the work temperature. Since the first temperature sensor T1 and the fourth temperature sensor T4 hereat are required to have high temperature detection accuracy, a Pt sensor using a platinum temperature measuring resistor is preferably used.

Of the above, the refrigerating cycle 100 serves as a primary temperature adjustment circuit of a circuit configuration in which the electric compressor 102 compresses a refrigerant gas and feeds the same to the condenser 103 on the delivery side as a high pressure gas, the condenser 103 condenses the high pressure gas and reduces the same through an expansion valve 104 of a pressure reducing mechanism, followed by being fed to the evaporator 101, and the evaporator 101 evaporates the reduced low pressure gas and sucks the same into the suction side of the electric compressor 102, after which the compression is repeated again. Further, here, the cooling device 300 is arranged which has a structure in which a piping is connected to the condenser 103 so as to be folded, and cooling water is taken therein to cool within the condenser 103, followed by being returned outwardly via a valve V7 provided in a pipe on the outlet side. The cooling device 300 is adapted in such a manner that the opening/closing of the valve V7 is controlled according to a result detected by pressure connected to the delivery side of the condenser 103 in an on state of a pressure switch PSW, and the flow rate of the cooling water flowing into each piping is controlled. Incidentally, a valve V6 provided on the suction side of the valve V7 is a valve for drainage. Incidentally, a cooling function with respect to the condenser 103 by the cooling device 300 described here may be of a configuration of performing cooling with cold air using a cooling fan.

The refrigerant cycle 200 serves as a secondary temperature adjustment circuit of a circuit configuration in which while sharing the evaporator 101 of the refrigerating cycle 100, refrigerant liquid is recovered by and stored in a refrigerant tank 201, and the refrigerant liquid is appropriately heated by the heating device 202 mounted to the refrigerant tank 201 or the refrigerant liquid sucked by the pump 203 is returned from the heating device 202 to the evaporator 101 via the work W without its heating.

Also, a heating control device 207 connected to the apparatus control unit 105 is controlled by the apparatus control unit 105 according to the temperature difference between the setting temperature and the work temperature detected by the first temperature sensor T1 to control the heating temperature by the heating device 200.

Further, a flow rate detecting sensor 204 is provided in a piping on the outflow side of the refrigerant liquid in the pump 203. The flow rate of the refrigerant liquid detected by the flow rate detecting sensor 204 is inputted to the apparatus control unit 105 where the flow rate is displayed, and the amount of suction of the refrigerant liquid by a manual valve is adjusted so that the refrigerant liquid is used in a flow rate more suitable than the value of the displayed flow rate. Consequently, the refrigerant liquid is kept at a nearly constant amount by a logic (LG) within the refrigerant tank 201.

In addition, a valve V1 provided in a pipe on the refrigerant delivery side of the evaporator 101, and a valve V2 provided in a pipe connected to the refrigerant tank 201 are connected to a common piping and used to perform drainage in connection with a drain D for drainage treatment. Besides, a valve V3 provided in a piping on the inflow side of the refrigerant liquid at the work W, and a valve V4 provided in a piping on the outflow side thereof are mainly used to prevent the leakage of the refrigerant liquid when the work W is piping-connected to a local part of the refrigerant cycle 200.

The chiller apparatus is common to the conventional product in terms of the details and configuration thereof described above and is the same in that the apparatus control unit 105 performs control of operation modes different according to the temperature difference between the initial setting temperature and the work temperature and that since the cooling function of the refrigerating cycle 100 is not required at the time of a high temperature setting in which a temperature difference (exceeding 10° C., for example) at which the setting temperature is much higher than the work temperature occurs, the operation mode of giving priority to a heating function so as to eliminate the temperature difference by suppressing the rotational speed of the electric compressor 102 low and setting the heating temperature of the heating device 202 of the refrigerant cycle 200 high is performed, and since the heating function by the heating device 202 of the refrigerant cycle 200 is not required at the time of a low temperature setting in which a temperature difference (exceeding 10° C., for example) at which the setting temperature is much lower than the work temperature occurs, the operation mode of giving priority to the cooling function so as to eliminate the temperature difference by setting high the rotational speed of the electric compressor 102 of the refrigerating cycle 100 without performing the setting of heating by the heating device 202 is executed.

Other functional configurations have been proposed as Japanese Patent Application No. 2014-033013 (Japanese Patent No. 5721875) by the present applicant. They are relevant to a technology of improving the structure and function that the electric compressor 102 continues to operate in a state in which at the time of a heat insulation setting where a temperature difference (5° C. to 10° C., for example) at which the setting temperature is close to the work temperature is small, a difference in the refrigerant temperature between the refrigerant suction side and the refrigerant delivery side of the evaporator 101 in the refrigerating cycle 100 is little caused in particular and in spite of no necessity to cause the refrigerant to flow in the evaporator 101.

Although the gist of the present invention relates to a functional configuration where a plasma treatment device to be described later is applied to the work W of the chiller apparatus shown in FIG. 1, a description will be made about a load measure technology for such an electric compressor 102 to provide a help for the understanding of the present invention prior to its description.

Described specifically, a first feature in the present chiller apparatus resides in having a second temperature sensor T2 which is provided on the front side of the refrigerant inflow relative to the heating device 202 on the refrigerant delivery side of the evaporator 101 in the refrigerant cycle 200 and detects a refrigerant temperature and in that at the time of a heat insulation setting where a temperature difference (5° C. to 10° C., for example) between the setting temperature and the work temperature is small, the apparatus control unit 105 performs a PID arithmetic operation including proportion, integration, and differentiation on the refrigerant detection temperature on the refrigerant cycle side, which is detected by the second temperature sensor T2, and outputs a drive control signal relative to an inverter 107 for driving the electric compressor 102, which is generated based on the result of the PID arithmetic operation by the apparatus control unit 105 to control the compressor rotational speed at the electric compressor 102 in a constant range according to the work temperature. Incidentally, since the second temperature sensor T2 hereat is also required to have high temperature detection accuracy, the Pt sensor using the platinum temperature measuring resistor is preferably used.

According to such a functional configuration, even when the temperature difference between the setting temperature and the work temperature is small, and there is substantially no difference in temperature between the refrigerant suction side and the refrigerant delivery side of the evaporator 101 in the refrigerating cycle 100, a function of causing the electric compressor 102 to operate without imposing an excessive load thereon to appropriately keep the amount of the refrigerant flowing into the evaporator 101 and thereby making a heat insulating operation stably is obtained.

Also, a second feature in the above chiller apparatus resides in having a first electronic expansion valve EV1 interposed and connected to the refrigerant suction side of the evaporator 101 in the refrigerating cycle 100 and driven by a first stepping motor SM1 and in that the apparatus control unit 105 performs a PID arithmetic operation including proportion, integration, and differentiation on the work temperature detected by the first temperature sensor T1 and drives the first stepping motor SM1 by a pulse signal generated based on the result of such a PID arithmetic operation to control the opening/closing of the first electronic expansion valve EV1 and thereby control the refrigerant flow rate.

According to such a functional configuration, since the amount of the refrigerant sucked into the evaporator 101 separately can suitably be controlled separately in the refrigerating cycle 100 in addition to the control of the rotational speed of the previous electric compressor 102, a function of performing a heat insulating operation more stably is obtained. Incidentally, the apparatus control unit 105 preferably calculates the amount of a thermal load on the work W side, based on the value of a difference between the refrigerant temperatures detected by the first temperature sensor T1 and the above-described fourth temperature sensor T4 (provided on the refrigerant outflow side relative to the work W on the refrigerant suction side of the evaporator 101 in the refrigerant cycle 200 to detect the refrigerant temperature), corrects a result obtained by performing the PID arithmetic operation, based on the refrigerant temperature detected by the second temperature sensor T2, using the calculated result of the thermal load amount, and performs feedforward control (feedforward control for the heat input) for improving responsiveness to opening control for the first electronic expansion valve EV1. If such a functional configuration is added, it is possible to appropriately perform control of the refrigerant flow rate corresponding to the thermal load amount on the work W side in the refrigerating cycle 100.

Further, a third feature in the above chiller apparatus resides in having a third temperature sensor T3 provided on the refrigerant suction side of the electric compressor 102, on the refrigerant delivery side of the evaporator 101 and on the refrigerant delivery side relative to the condenser 103 and for detecting a refrigerant temperature in the refrigerating cycle 100, and a first bypass flow path 108 for a refrigerant bypass, which connects a spot positioned on the refrigerant suction side of the evaporator 101 and on the side of the condenser 103 equipped in the refrigerating cycle 100 rather than the first electronic expansion valve EV1, and the refrigerant delivery side of the evaporator 101, and which is connected with a second electronic expansion valve EV2 interposed therein, which is driven by a second stepping motor SM2, and in that the apparatus control unit 105 performs a PID arithmetic operation including proportion, integration, and differentiation on the refrigerating cycle-side refrigerant temperature detected by the third temperature sensor T3 and drives the second stepping motor SM2 by a pulse signal generated based on the result of such a PID arithmetic operation to control the opening/closing of the second electronic expansion valve EV2 and thereby control the flow rate of the refrigerant in the first bypass flow path 108. Incidentally, since the third temperature sensor T3 hereat is not required to have high detection accuracy as much as the second temperature sensor T2, a thermocouple sensor using a general thermocouple is preferably used in consideration of manufacturing costs. According to such a functional configuration, since a bypass flow rate of the refrigerant using the first bypass flow path 108 in the refrigerating cycle 100 can be controlled separately in addition to the control of the rotational speed of the electric compressor 102 and the control of the amount of the refrigerant sucked into the evaporator 101, which are described previously, the amount of inflow of the refrigerant into the evaporator 101 can be controlled more finely, and the function of the heat insulating operation is remarkably improved.

In addition, a fourth feature in the above chiller apparatus resides in having a pressure sensor P1 which is provided on the refrigerant suction side of the electric compressor 102 in the refrigerating cycle 100 and detects refrigerant pressure, and a second bypass flow path 109 for a refrigerant bypass, which connects a spot positioned on the refrigerant suction side of the evaporator 101 rather than the first electronic expansion valve EV1 and the refrigerant delivery side of the electric compressor 102, and which is connected with a third electronic expansion valve EV3 interposed therein, which is driven by a third stepping motor SM3, and in that the apparatus control unit 105 performs a PID arithmetic operation including proportion, integration, and differentiation on the refrigerant pressure detected by the pressure sensor P1 and drives the third stepping motor SM3 by a pulse signal generated based on the result of such a PID arithmetic operation to control the opening/closing of the third electronic expansion valve EV3 and thereby control the flow rate of the refrigerant in the second bypass flow path 109.

According to such a functional configuration, since a bypass flow rate of the refrigerant using the second bypass flow path 109 in the refrigerating cycle 100 can be further controlled separately in addition to the control of the rotational speed of the electric compressor 102, the control of the amount of the refrigerant sucked into the evaporator 101, and the control of the bypass flow rate of the refrigerant using the first bypass flow path 108, which are described previously, the inflow amount of the refrigerant into the evaporator 101 can be controlled extremely finely, and the function of the heat insulating operation becomes extremely good. Incidentally, the second bypass flow path 109 hereat is for preventing the refrigerant from being sucked into the electric compressor 102 in a liquid state without being completely vaporized where the cooling load is small, and plays a role in a hot gas bypass circuit which reduces a cooling amount by bypassing a refrigerant gas (hot gas) in a high-temperature/high-pressure state. In addition, when the refrigerating cycle 100 has the second bypass flow path 109 for the refrigerant bypass as in the refrigerating cycle 100 hereat, the apparatus control unit 105 preferably drives the third stepping motor SM3 by a pulse signal generated based on the result obtained by performing a PID arithmetic operation including proportion, integration, and differentiation on the refrigerant temperature detected by the above-described third temperature sensor T3 (provided on the refrigerant delivery side relative to the condenser 103 on the refrigerant suction side of the electric compressor 102 in the refrigerating cycle 100 to detect the refrigerant temperature) to control the opening/closing of the third electronic expansion valve EV3 and outputs a drive control signal for the inverter 107 for driving the electric compressor 102, which is generated to keep the degree of opening of the third electronic expansion valve EV3 at a predetermined amount, and controls the compressor rotational speed of the electric compressor 102 in a prescribed range according to the work temperature. Since control of the compressor rotational speed of the electric compressor 102 according to the thermal load in the refrigerating cycle 100 is performed with good accuracy if such a functional configuration is added, control of the refrigerant flow rate in the refrigerating cycle 100 is performed with higher reliability.

Meanwhile, in terms of the fourth feature, when performing the PID arithmetic operation by the apparatus control unit 105, the apparatus control unit 105 may be adapted to calculate a refrigerant saturation temperature on the refrigerating cycle 100 side corresponding to the refrigerant pressure detected by the pressure sensor P1 by substitution with an approximation curve, make lower the calculated refrigerant temperature on the refrigerating cycle 100 side by a prescribed temperature range (−4° C. to −50° C., for example) than the setting temperature at the setting change by the user to conduct automatic temperature setting control for the initial setting temperature, and perform control of the refrigerant flow rate in the second bypass flow path 109 under opening/closing control of the third electronic expansion valve EV3 as such automatic temperature setting control. Incidentally, the approximation curve of the refrigerant saturation temperature corresponding to the refrigerant pressure hereat can be stored in the ROM or the like equipped in the apparatus control unit 105 in advance as a tabular converted value and read by the CPU or the like.

According to such a functional configuration, at the time of a heat insulation setting where a temperature difference (5° C. to 10° C., for example) at which the setting temperature is close to the work temperature is small, the automatic temperature setting control at the setting change by the user is a function different from the control of the PID arithmetic result of the compressor rotational speed of the electric compressor 102 by the above-described apparatus control unit 105, the control of the refrigerant flow rate as the PID arithmetic result in the first bypass flow path 108 under the control of the opening/closing of the second electronic expansion valve EV2, and the control of the refrigerant flow rate as the PID arithmetic result in the second bypass flow path 109 under the control of the opening/closing of the third electronic expansion valve EV3, but these may be controlled in combination. In such a case, particularly since the third electronic expansion valve EV3 is controlled in opening/closing via the second bypass flow path 109 from the high pressure delivery side of the electric compressor 102 to enable the refrigerant to efficiently flow into the refrigerant suction side of the evaporator 101, it is possible to independently improve the refrigerating function in the refrigerating cycle 100 where there occurs a situation in which rapid cooling is required for the work W. As a result, the function is not available in the prior art as a function intended for the user, and hence the work W can be cooled efficiently.

In terms of the details and configuration of the above chiller apparatus described above, any of the cooling device 300, the refrigerant cycle 200 or the control device can be changed in various ways. For example, since the apparatus control unit 105 which forms the control device can be configured by a single printed circuit board (PCB) or may also be of a configuration of being divided into two or more sheets of substrates by function, the apparatus control unit 105 is not limited to the disclosed one.

Meanwhile, in the case of the functional configuration in which the plasma treatment device is applied to the work W in the above chiller apparatus, a technical summary is that assuming that the heating function is improved by addition of the heating device 202 of the refrigerant cycle 200 or the like to thereby make a specification (specification of heat insulation upper-limit temperature 130° C. or so exceeding 100° C., for example) in which a heat insulation upper-limit temperature is raised, the apparatus control unit 105 feedback controls the degree of heating to the heating device 202 in the refrigerant cycle 200 of each system, based on the result of detection of the temperature of the refrigerant flowing while circulating the pipings branched into the number of the systems of the respective parts to be heat-insulated in the plasma treatment device to thereby heat-insulation control the respective parts to be heat-insulated in the plasma treatment device. Besides, although the function of reflecting thermal load information indicated by the degree of heating of the heating device 202 in the refrigerant cycle 200 of each system onto the rotational control of the electric compressor 102 of the refrigerating cycle 100 to perform the feedforward control is required, a functional configuration for a countermeasure against the load of the electric compressor 102 on the refrigerating cycle 100 side may be of a simplified configuration if there are cost restrictions or the like. For example, the functional configuration related to the first bypass flow path 108 or the second bypass flow path 109 in the refrigerating cycle 100 shown in FIG. 1 may be of a configuration free of its provision.

Figure 2:
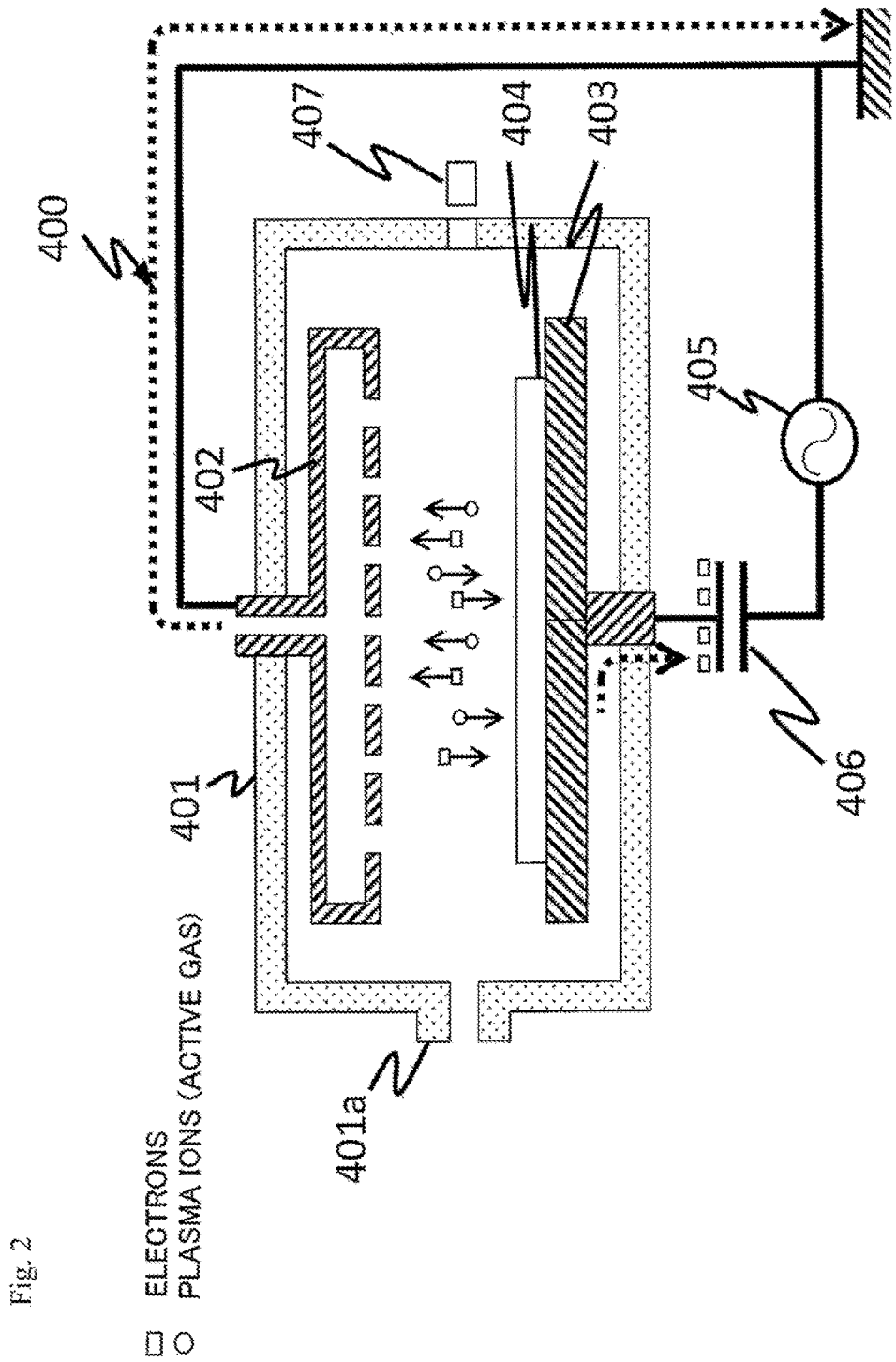
FIG. 2 is a diagram showing a schematic configuration of the plasma treatment device as the work of the chiller apparatus shown in FIG. 1.

FIG. 2 is a diagram showing a schematic configuration of a plasma treatment device 400 which serves as the work W of the above-described chiller apparatus.

Referring to FIG. 2, the present plasma treatment device 400 is for performing plasma treatment to etch a sample 404 to be a target. The present embodiment is assumed to be applied to the case where the sample 404 is large in surface area as in the case where the sample 404 is a flat panel display (FPD) of a glass substrate system. The plasma treatment device 400 is equipped within a vacuum vessel (chamber) 401 with a lower electrode (cathode electrode) 403 on which the sample 404 is placed in common use for a large sample table and which is coupled to a lid part, a lower electrode refrigerant pipe schematically illustrated in FIG. 2, which is attached to the surface of the lower electrode 403 opposite to the side of placement of the sample 404 so as to enable the refrigerant flow path to branch and connected to be linked to the refrigerant cycle 200 inclusive of a heat insulating portion which heat-insulates the lower electrode 403, a schematically-illustrated temperature sensor for the lower electrode refrigerant pipe, which is provided in the vicinity of the heat insulating portion of the lower electrode refrigerant pipe and outputs a result of detection of a refrigerant temperature of the lower electrode refrigerant pipe as a lower electrode refrigerant pipe refrigerant detection temperature indicative of a work temperature, an upper electrode (anode electrode) 402 arranged opposite to the lower electrode 403 and having a lid part in an integral manner, an upper electrode refrigerant pipe schematically illustrated in FIG. 2, which is attached so as to include the lid part in the upper electrode 402 and connected so as to be linked to the refrigerant cycle 200 inclusive of the heat insulating portion which heat-insulates the upper electrode 402, a schematically-illustrated temperature sensor for the upper electrode refrigerant pipe, which is provided in the vicinity of the upper electrode refrigerant pipe and outputs a result of detection of a refrigerant temperature of the upper electrode refrigerant pipe as an upper electrode refrigerant pipe refrigerant detection temperature indicative of the work temperature, and besides is configured to be provided additionally with a vacuum chamber refrigerant pipe schematically illustrated in FIG. 2, which is connected so as to be linked to the refrigerant cycle 200 at the wall of the vacuum chamber 401 and includes a heat insulating portion which heat-insulates the wall of the vacuum chamber 401, and to be provided in the vicinity of the heat insulating portion of this vacuum chamber refrigerant pipe with a temperature sensor for the vacuum chamber refrigerant pipe, which outputs a result of detection of a refrigerant temperature of the vacuum chamber refrigerant pipe as a vacuum chamber refrigerant pipe refrigerant detection temperature indicative of the work temperature.

Further, the vacuum chamber 401 is provided with a gas suction port 401a for introducing an active gas (reactive gas) for etching. The upper electrode 402 includes a ground (GND) spot through the lid part extended outward, and is electrically connected like a loop to the lower electrode 403 through the outwardly extending lid part of the lower electrode 403 with a radio frequency (RF) oscillator 405 and a blocking condenser 406 being interposed therein. Further, a light emission detector 407 is provided in the neighborhood of a window provided in a prescribed place of the wall opposite to the gas suction port 401a of the vacuum chamber 401. The light emission detector 407 is capable of monitoring a light emitting state when in a state in which the reactive gas for etching is introduced into the vacuum chamber 401 from the gas suction port 401a, and a high voltage is applied between the upper electrode 402 and the lower electrode 403 at radio frequency by an unillustrated power supply to give a prescribed potential difference, the active gas is ionized to generate a plasma for etching and thus etching based on plasma treatment is performed.

Incidentally, in the state in which the active gas is ionized by the plasma treatment, the plus ions of the active gas are attracted to the sample 404 of the lower electrode 403 as the cathode electrode and subjected to etching, but electrons perform diverse behaviors and are directed to the sample 404. Besides, the electrons are grounded through the upper electrode 402 and considerable portions thereof are subjected to charge accumulation at the blocking condenser 406 through the lower electrode 403 and stored therein.

In the case of the plasma treatment device 400 hereat, the lower electrode refrigerant pipe refrigerant detection temperature detected from the temperature sensor for the lower electrode refrigerant pipe, which is provided in the vicinity of the heat insulating portion relative to the lower electrode 403 additionally provided so as to enable the refrigerant flow path of the lower electrode refrigerant pipe connected to the lower electrode 403 with the sample 404 placed thereon so as to be linked with the refrigerant cycle 200 to branch is transmitted to the apparatus control unit 105 which configures the control device. Therefore, a heating adjustment control signal for adjusting and controlling the heating degree of the heating device 202 is generated based on a result obtained by performing a PID arithmetic operation including proportion, integration, and differentiation on the lower electrode refrigerant pipe refrigerant detection temperature from the temperature sensor for the lower electrode refrigerant pipe by the apparatus control unit 105 and transmitted to the apparatus control unit 105, and the apparatus control unit 105 transmits the heating adjustment control signal to the heating device 202, thereby making it possible to perform first feedback control (which may be called external control) so that the lower electrode refrigerant pipe refrigerant detection temperature becomes the setting temperature.

If such a first feedback control function is given, even though the sample 404 in the plasma treatment device 400 is large in surface area as in the case where it is of the flat panel display (FPD), the lower electrode 403 placed in common use for the sample table is large in size, the length of the lower electrode refrigerant pipe including the heat insulating portion to the lower electrode 403 is considerably long, and a temperature fluctuation due to a thermal load is caused by the influence of the plasma treatment, the detection of transfer of the fluctuation in the thermal load is performed promptly and the apparatus control unit 105 performs feedback control of the heating degree to the heading device 202, based on the result of its detection, and performs feedforward control reflected on the control of the rotational speed of the electric compressor 102 in the refrigerating cycle 100 through the inverter 107 and the control of the refrigerant flow rate by the pump 203 linked to the refrigerant tank 201 of the refrigerant cycle 200 through the inverter 206, based on thermal load information indicated by the heating degree, thereby making it possible to heat-insulate and control the lower electrode 403 with good accuracy and consequently etch the sample 404 uniformly with required accuracy without unevenness. Thus, the work temperature at the fourth temperature sensor T4 detecting the refrigerant temperature on the refrigerant delivery side of the plasma treatment device 400 can be obtained with high accuracy. Incidentally, the fourth temperature sensor T4 in the refrigerant cycle 200 hereat is provided on the refrigerant delivery side in the plasma treatment device 400 and functions as a work delivery-side temperature sensor which outputs the result of detection of the refrigerant delivery temperature as a refrigerant delivery detection temperature.

Incidentally, if the lower electrode 403 is practically large-sized, the heat insulating portion of the lower electrode refrigerant pipe with respect to the lower electrode 403 is preferably provided thereinside with the refrigerant flow path based on a zigzag-like flow path hole and configured by assembling in a plural form, panel members each having heat resistance, which has corrosion resistant to the refrigerant. In this case, the lower electrode refrigerant pipe has a composite structure in which the branch pipe branched on the refrigerant cycle 200 side passes through the vacuum chamber 401, and the spots serving as refrigerant inlet-outlet ports of the flow path hole in each panel member are coupled by pipings. As to the specification of the branching of the lower electrode refrigerant pipe, the lower electrode refrigerant pipe is branched at a spot on the downstream side of the flow of the refrigerant, of the first temperature sensor T1 in the refrigerant cycle 200 and on the refrigerant suction side of the plasma treatment device 400 as the work W. As to the merging of branches, they are merged at a spot on the refrigerant delivery side of the plasma treatment device 400 and on the upstream side along the refrigerant flow, of the fourth temperature sensor T4.

In this case, it is desirable that the refrigerant temperature sensor for the lower electrode refrigerant pipe is provided in plural including a main sensor provided in the vicinity of the flow path hole (refrigerant flow path) close to the central point of the lower electrode 403 in the panel member, and a sub sensor provided in the vicinity of the flow path hole (refrigerant flow path) away from the central point, and besides, the apparatus control unit 105 generates a heating adjustment control signal, based on a result obtained by performing a PID arithmetic operation including proportion, integration, and differentiation on lower electrode refrigerant pipe refrigerant detection temperatures respectively detected by those temperature sensors for the lower electrode refrigerant pipe, and the apparatus control unit 105 transmits the generated heating adjustment control signal to the heating device 202 to be subjected to the first feedback control.

If the first feedback control based on the heating adjustment control signal generated by acquiring the lower electrode refrigerant pipe refrigerant detection temperature from each spot in the vicinity of the refrigerant flow path, of the heat insulating portion of such a branched lower electrode refrigerant pipe is performed, the detection of the transfer of a fluctuation in thermal load relating to the lower electrode 403 is performed more appropriately, and its detection result can be reflected onto the feedback control of the degree of heating to the heating device 202 with good accuracy. Therefore, the lower electrode 403 can be heat-insulated and controlled more precisely, and consequently, the sample 404 can be etched uniformly with higher accuracy.

Figure 3:
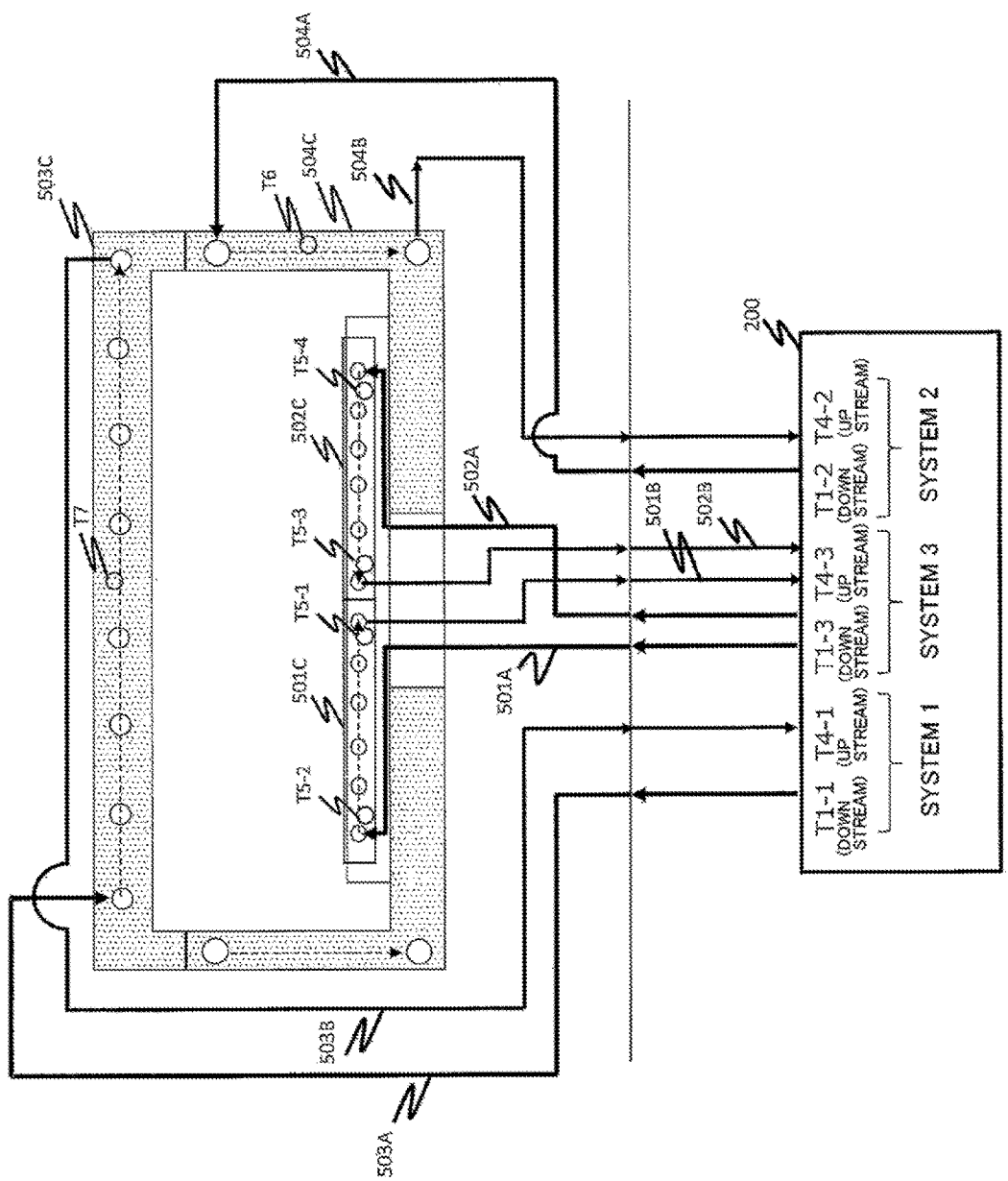
FIG. 3 is a diagram showing a schematic configuration of heat insulating portions of respective parts to be heat-insulated in the plasma treatment device shown in FIG. 2, and connecting points of pipings in the refrigerant cycle.

FIG. 3 is a diagram showing a schematic configuration of heat insulating portions 501C, 502C, 503C, and 504C of respective parts to be heat-insulated in the above-described plasma treatment device 400, and connecting points of pipings in the refrigerant cycle 200. Also, FIG. 4 is a diagram illustrating a schematic configuration of by-system refrigerant cycles 200-1 to 200-3 required when the heat insulating portions of the respective parts in the plasma treatment device 400 are connected to the refrigerant cycle 200.

Figure 4:
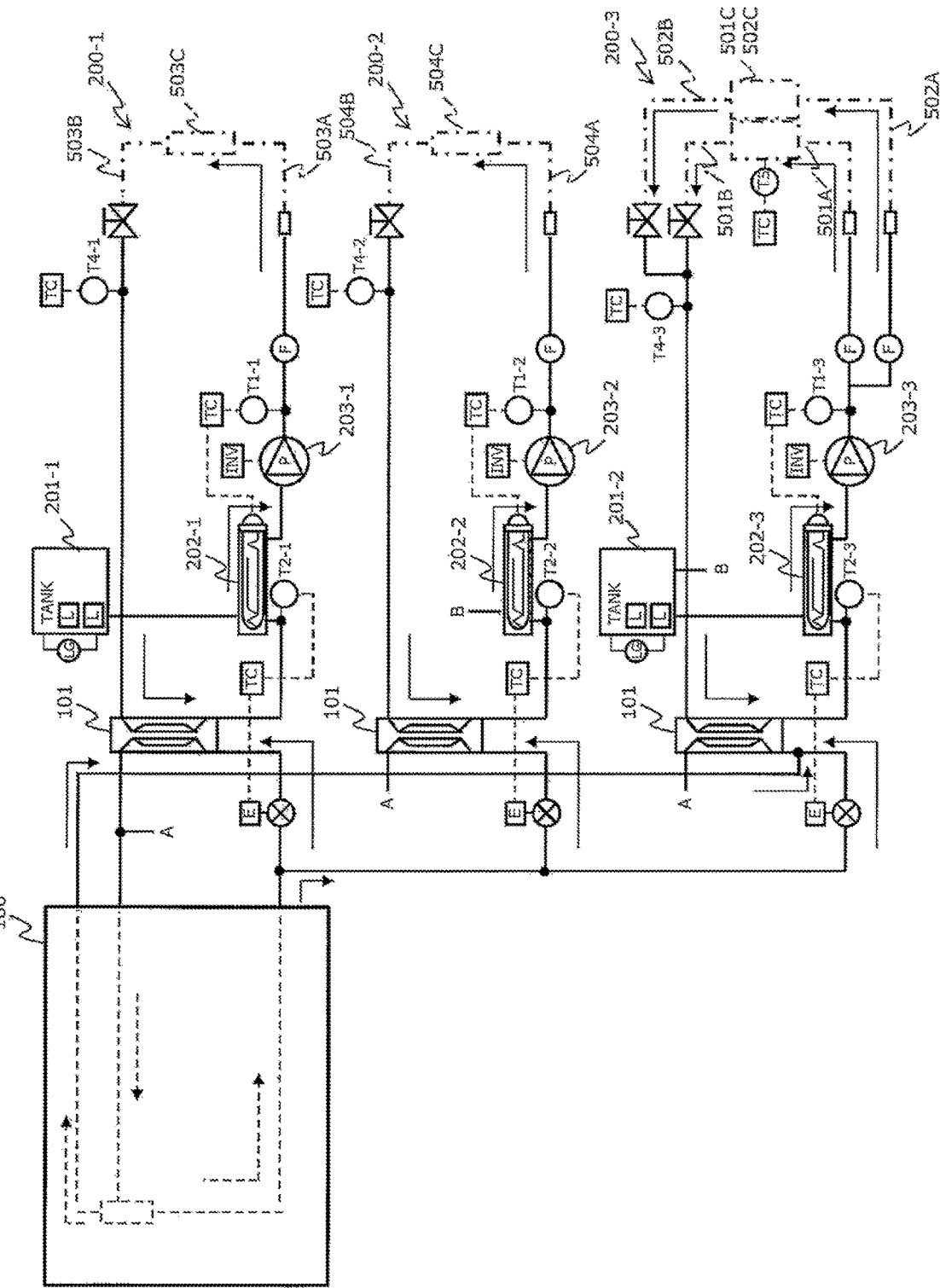
FIG. 4 is a diagram illustrating a schematic configuration of by-system refrigerant cycles required when the heat insulating portions of the respective parts in the plasma treatment device described in FIG. 3 are connected to the refrigerant cycle.

First, referring to FIG. 3, the lower electrode refrigerant pipe attached to the lower electrode 403 in the connection relation with the refrigerant cycle 200 and connected so as to be linked to the refrigerant cycle 200 is configured, in terms of the heat insulating portions 501C and 502C configured by two panel members so as to enable the refrigerant flow path to be branched, to be equipped with a first sucking lower electrode refrigerant branch pipe 501A and a first delivering lower electrode refrigerant branch pipe 501B (corresponding to the refrigerant cycle 200-3 of the system 3 in FIG. 4) indicative of pipings coupled to spots to be refrigerant inlet-outlet ports of a flow path hole (refrigerant flow path) of the heat insulating portion 501C provided in junction with the half of the lower electrode 403, and a second sucking lower electrode refrigerant branch pipe 502A and a second delivering lower electrode refrigerant branch pipe 502B (corresponding to the refrigerant cycle 200-3 of the system 3 in FIG. 4) indicative of pipings coupled to spots to be refrigerant inlet-output ports of a flow path hole (refrigerant flow path) of the heat insulating portion 502C provided in junction with the remaining half of the lower electrode 403. Any of the pipe lengths L of the respective pipings is specified to be 20 m at maximum (max). With such a configuration, the refrigerant flows from the peripheral edge portion of the lower electrode 403 to the vicinity of its center in the right direction in FIG. 3 in the heat insulating portion 501C, and the refrigerant flows from the peripheral edge portion of the lower electrode 403 to the vicinity of its center in the left direction in FIG. 3 in the heat insulating portion 502C, whereby the lower electrode 403 is heat-insulated.

In addition, a refrigerant temperature sensor T5-1 for a lower electrode refrigerant pipe, which serves as a main sensor is provided at a corresponding portion of a spot close to the center of the lower electrode 403 in the vicinity of the refrigerant flow path in the heat insulating portion 501C, and a refrigerant temperature sensor T5-2 for the lower electrode refrigerant pipe, which serves as a sub sensor is provided at a peripheral portion separated therefrom. A refrigerant temperature sensor T5-3 for the lower electrode refrigerant pipe, which serves as a main sensor is provided at a corresponding portion of a spot close to the center of the lower electrode 403 in the vicinity of the refrigerant flow path in the heat insulating portion 502C, and a refrigerant temperature sensor T5-4 (sub sensor) for the lower electrode refrigerant pipe, which serves as a sub sensor is provided at a peripheral portion separated therefrom. A refrigerant temperature sensor T5-$n$ for the lower electrode refrigerant pipe may be allowed to apply configurations other than those illustrated, such as a configuration of independently providing the main sensors in the vicinity of the refrigerant flow paths of the heat insulating portions 501C and 502C corresponding to the neighborhood of the center of the lower electrode 403, or a configuration of further providing the sub sensors in the vicinity of the refrigerant flow paths of the heat insulating portions 501C and 502C corresponding to the neighborhood of the fourth corners of the lower electrode 403, etc.

Referring to FIG. 4, the refrigerant cycle 200-3 of the system 3 is connected with a heating device 202-3 spacedly via a piping with respect to a dedicated refrigerant tank 201-2 (shared with a heating device 202-2 of a refrigerant cycle 200-2 of a system 2) and provided with a dedicated second temperature sensor T2-3 between the heating device 202-3 and the evaporator 101, and has a dedicated pump 203-3 which sucks the refrigerant through a case from the refrigerant tank 201-2 to the heating device 202-3. Besides, the refrigerant cycle 200-3 is provided with a branch spot of a first sucking lower electrode refrigerant branch pipe 501A and a second sucking lower electrode refrigerant branch pipe 502A on the downstream side of a dedicated first temperature sensor T1-3 and provided on the upstream side of a dedicated fourth temperature sensor T4-3 with a merging spot of branches for a first delivering lower electrode refrigerant branch pipe 501B and a second delivering lower electrode refrigerant branch pipe 502B through valves for refrigerant flow rate adjustment respectively.

Further, since the upper electrode refrigerant pipe attached to the upper electrode 402 and connected to be linked with the refrigerant cycle 200 is attached to the wall of the vacuum chamber 401 in a configuration in which the upper electrode 402 has a lid part in an integral manner, the heat insulating portion 503C provided with a refrigerant flow path based on a zigzag-like flow path hole within an upper wall portion on the ceiling side of the vacuum chamber 401 is configured to be equipped with a sucking upper electrode refrigerant pipe 503A and a delivering upper electrode refrigerant pipe 503B (corresponding to the refrigerant cycle 200-1 of the system 2 in FIG. 4) indicative of pipings coupled to spots to be refrigerant inlet-output ports of its flow path hole (refrigerant flow path). Even as to each piping hereat, any pipe length L is specified to be 20 m at maximum (max). With such a configuration, the refrigerant flows in the right direction in FIG. 3 in the heat insulating portion 503C, and the heat insulating portion 503C is adapted to heat-insulate the main body of the upper electrode 402 with the lid part of the upper electrode 402 as a transmission medium.

Besides, a refrigerant temperature sensor T7 for the upper electrode refrigerant pipe is provided at a prescribed spot in the vicinity of the refrigerant flow path in the heat insulating portion 503C. The temperature sensor T7 for the upper electrode refrigerant pipe hereat may also be of a configuration of being provided in a plural form so as to be dispersed to the upper wall portion on the ceiling side.

Incidentally, when the refrigerant flow path is not capable of being provided within the upper wall portion on the ceiling side of the vacuum chamber 401, another panel member provided with the zigzag-like flow path hole as in the case of the panel member attached to the lower electrode 403 is used as a substitute and may be provided at the upper wall portion on the ceiling side or attached to the lid part side of the upper electrode.

Referring to FIG. 4, the refrigerant cycle 200-1 of the system 1 is connected with a dedicated heating device 202-1 spacedly via a piping with respect to a dedicated refrigerant tank 201-1 and provided with a second temperature sensor T2-1 between the heating device 202-1 and the evaporator 101, and has a dedicated pump 203-1 which sucks the refrigerant through a case from the refrigerant tank 201-1 to the heating device 202-1. Besides, the refrigerant cycle 200-1 is provided with an upper electrode refrigerant pipe 503A for suction on the downstream side of a dedicated first temperature sensor T1-1 and provided with an upper electrode refrigerant pipe 503B for delivery on the upstream side of a dedicated fourth temperature sensor T4-1 through a valve for refrigerant flow rate adjustment.

Further, the vacuum chamber refrigerant pipe attached to the wall of the vacuum chamber 401 and connected to be linked with the refrigerant cycle 200 is configured such that the heat insulating portion 504C provided with the refrigerant flow path based on the flow path hole so as to be circulated within the side wall portion of the vacuum chamber 401 is equipped with a vacuum chamber refrigerant pipe 504A for suction and a vacuum chamber refrigerant pipe 504B for delivery (corresponding to the refrigerant cycle 200-2 of the system 1 in FIG. 4) indicative of pipings coupled to spots to be refrigerant inlet-outlet ports of the flow path hole (refrigerant flow path) thereof. Even as to each piping hereat, any pipe length L is specified to be 20 m at maximum (max). With such a configuration, in the heat insulating portion 504C, the refrigerant flows downward in FIG. 3 while circulating within the side wall portion of the vacuum chamber 401 to heat-insulate the entire side wall of the vacuum chamber 401.

Besides, a refrigerant temperature sensor T6 for the vacuum chamber refrigerant pipe is provided at a prescribed spot in the vicinity of the refrigerant flow path in the heat insulating portion 503C. The refrigerant temperature sensor T6 for the vacuum chamber refrigerant pipe hereat may also be of a configuration of being provided in a plural form so as to be dispersed into the side wall portion.

Incidentally, when the refrigerant flow path is not capable of being provided at the side wall portion of the vacuum chamber 401, another large-sized panel member provided with the circulation-like flow path hole as in the case of the panel member described in the upper electrode 402 is used as a substitute and may be attached to the side wall portion of the vacuum chamber 401.

Referring to FIG. 4, the refrigerant cycle 200-2 of the system 2 uses the refrigerant tank 201-2 in common use with the refrigerant cycle 200-3 of the system 3 and in contrast is connected with a heating device 202-2 spacedly via a piping, and provided with a dedicated second temperature sensor T2-2 between the heating device 202-2 and the evaporator 101, and has a dedicated pump 203-2 which sucks the refrigerant through a case from the refrigerant tank 201-2 to the heating device 202-2. Besides, the refrigerant cycle 200-2 is provided with a vacuum chamber refrigerant pipe 504A for suction on the downstream side of a dedicated first temperature sensor T1-2 and provided with a vacuum chamber refrigerant pipe 504B for delivery on the upstream side of a dedicated fourth temperature sensor T4-2 through a valve for refrigerant flow rate adjustment.

As a guide for heat insulation control of each part in the plasma treatment device 400, there can be illustrated a case where the first sucking lower electrode refrigerant branch pipe 501A and the first delivering lower electrode refrigerant branch pipe 501B, and the second sucking lower electrode refrigerant branch pipe 502A and the second delivering lower electrode refrigerant branch pipe 502B in the lower electrode refrigerant pipes are set to be heat-insulated in a temperature range of 0 to 110° C., and the heat insulating portions 501C and 502C for the lower electrode 403 are heat-insulated and maintained at about 30° C. Further, there can be illustrated a case where the upper electrode refrigerant pipe 503A for suction and the upper electrode refrigerant pipe 503B for delivery are set to be heat-insulated in a temperature range of 20 to 110° C., and the vacuum chamber refrigerant pipe 504A for suction and the vacuum chamber refrigerant pipe 504B for delivery are set to be heat-insulated in a temperature range of 20 to 130° C.

Meanwhile, in the refrigerant cycles 200-1 to 200-3 of the respective systems in the chiller apparatus according to the embodiment, the first temperature sensors T1-1 to T1-3 respectively function as a work suction-side temperature sensor which is provided on the refrigerant suction side in the plasma treatment device 400 and outputs a detection result of a refrigerant return temperature as a refrigerant return detection temperature. Therefore, the above-described apparatus control unit 105 generates heating adjustment control signals for adjusting and controlling the heating degree of the heating device 202, based on a result (PID arithmetic result of system 3) of a PID arithmetic operation including proportion, integration, and differentiation on lower electrode refrigerant pipe refrigerant detection temperatures detected by the refrigerant temperature sensors T5-1 to T5-4 for the lower electrode refrigerant pipe, a result (PID arithmetic result of system 1) of a PID arithmetic operation including proportion, integration, and differentiation on the upper electrode refrigerant pipe refrigerant detection temperature detected by the refrigerant temperature sensor T7 for the upper electrode refrigerant pipe, and a result (PID arithmetic result of system 2) of a PID arithmetic operation including proportion, integration, and differentiation on the vacuum chamber refrigerant pipe refrigerant detection temperature detected by the refrigerant temperature sensor T6 for the vacuum chamber refrigerant pipe, respectively, and transmits the heating adjustment control signals generated by the apparatus control unit 105 to the heating device 202 to enable second feedback control (may be called return control) to be done, in such a manner that the refrigerant return detection temperatures detected by the work suction-side temperature sensors (first temperature sensors T1-1 to T1-3) respectively become a setting value.

If such a second feedback control function is given, the refrigerant return detection temperature is less deviated from the setting temperature to be a target to the plasma treatment device 400 taken as the work W. Thus, the heat insulation control of the entire plasma treatment device 400 including the wall of the vacuum chamber 401 in addition to the lower electrode 403 and the upper electrode 402 is appropriately carried out. When the operation is made by cascade control as the configuration of loop control in conjunction with the previous first feedback control function, it is possible to quickly feed back a fluctuation in thermal load and thereby extremely enhance responsiveness to the heat insulation control of the lower electrode 403 because followability to the heat insulation control of the lower electrode 403 is excellent in particular. As a result, the sample 404 can be etched uniformly with high accuracy to a degree unmeasurable in the well-known art.

Further, the above-described fourth temperature sensors T4-1 to T4-3 also respectively function as a work delivery-side temperature sensor which is provided on the refrigerant delivery side in the plasma treatment device 400 and outputs a detection result of a refrigerant delivery temperature as a refrigerant delivery detection temperature. Therefore, similarly, the above-described apparatus control unit 105 generates heating adjustment control signals for adjusting and controlling the degree of heating of the heating device 202, based on a result (PID arithmetic result of system 3) of a PID arithmetic operation including proportion, integration, and differentiation on the lower electrode refrigerant pipe refrigerant detection temperatures detected by the refrigerant temperature sensors T5-1 to T5-4 for the lower electrode refrigerant pipe, a result (PID arithmetic result of system 1) of a PID arithmetic operation including proportion, integration, and differentiation on the upper electrode refrigerant pipe refrigerant detection temperature detected by the refrigerant temperature sensor T7 for the upper electrode refrigerant pipe, and a result (PID arithmetic result of system 2) of a PID arithmetic operation including proportion, integration, and differentiation on the vacuum chamber refrigerant pipe refrigerant detection temperature detected by the refrigerant temperature sensor T6 for the vacuum chamber refrigerant pipe, respectively in such a manner that the refrigerant delivery detection temperatures detected by the work delivery-side temperature sensors (fourth temperature sensors T4-1 to T4-3) respectively become a setting value, and the apparatus control unit 105 transmits the generated heating adjustment control signals to the heating device 202 to enable third feedback control (may be called supply control) to be done.

If such a third feedback control function is given, the refrigerant delivery detection temperature is less deviated from the setting temperature to be a target to the plasma treatment device 400 taken as the work W in proportion to the refrigerant return detection temperature. Thus, the heat insulation control of the entire plasma treatment device 400 is appropriately carried out in a manner similar to the case where the second feedback control function is provided. If the operation is made by cascade control as the configuration of the loop control in conjunction with the previous first feedback control function, it is possible to feed back a fluctuation in thermal load considerably fast and thereby enhance responsiveness to the heat insulation control of the lower electrode 403. Similarly, the sample 404 can be etched uniformly with high accuracy to a degree unmeasurable in the well-known art.

Incidentally, the chiller apparatus for the plasma treatment device according to the embodiment is capable of, for example, cascade control of causing the first feedback control, the second feedback control or the third feedback control in the apparatus control unit 105 to be done independently by switching setting or to be selectively done in combination by switching setting, and besides is caused to have a function of reflecting thermal load information indicated by the degree of heating in the first feedback control, the second feedback control or the third feedback control to the control of the rotational speed of the electric compressor 102 of the refrigerating cycle 100 to perform feedforward control.

According to the chiller apparatus for the plasma treatment device according to the embodiment having such a control function, in order to improve the heat insulation accuracy of the lower electrode 403 (heat insulating portion 501C, 502C) in particular on the basis of execution of the heat insulation control of the entire plasma treatment device 400 as the work W, the optimum heat insulation control is selected for each of the upper electrode 402 (heat insulating portion 503C), the wall (heat insulating portion 504C) of the vacuum chamber 401, and the lower electrode 403 (heat insulating portion 501C, 502C) of the respective parts to be heat-insulated, and the composite control is made executable under the cascade control. It is therefore possible to perform the heat insulation control with good accuracy even if the surface area is large as in the case where the sample 404 as the target is of the flat panel display (FPD), and the lower electrode 403 sharing the sample table is large-sized. As a result, the sample 404 can be etched uniformly with high accuracy more than conventional.

Incidentally, although a description has been made of the case where in the chiller apparatus for the plasma treatment device according to the embodiment, the branching is done outside the vacuum chamber 401 of the plasma treatment device 400 with the branching of the lower electrode refrigerant pipe as the two systems, the branching of the lower electrode refrigerant pipe may be set to three or more systems or may also be of a configuration to be done within the vacuum chamber 401 of the plasma treatment device 400. The disclosure of the temperature range as the guide for heat insulation control of each part in the plasma treatment device 400 described with reference to FIG. 3 is an example consistently and may be changed in various ways. Accordingly, the chiller apparatus for the plasma treatment device of the present invention is not limited to the form disclosed in the embodiment.

REFERENCE SIGNS LIST

100 . . . Refrigerating cycle
101 . . . Evaporator (heat exchanger)
102 . . . Electric compressor
103 . . . Condenser
104 . . . Expansion valve
105 . . . Apparatus control unit
107, 206 . . . Inverter
108 . . . First bypass flow path
109 . . . Second bypass flow path
200, 200-1~200-3 . . . Refrigerant cycle
201, 201-1, 202-2 . . . Refrigerant tank
202, 202-1~202-3 . . . Heating device (heater)
203, 203-1~203-3 . . . Pump
204 . . . Flow rate detecting sensor
207 . . . Heating control device
300 . . . Cooling device
400 . . . Plasma treatment device
401 . . . Vacuum vessel (chamber)

401a . . . Gas suction port
402 . . . Upper electrode (anode electrode)
403 . . . Lower electrode (cathode electrode)
404 . . . Sample (target)
405 . . . Radio frequency (RF) oscillator
406 . . . Blocking condenser
407 . . . Light emission detector
501A . . . First sucking lower electrode refrigerant branch pipe
501B . . . First delivering lower electrode refrigerant branch pipe
502A . . . Second sucking lower electrode refrigerant branch pipe
502B . . . Second delivering lower electrode refrigerant branch pipe
503A . . . Upper electrode refrigerant pipe for suction
503B . . . Upper electrode refrigerant pipe for delivery
504A . . . Vacuum chamber refrigerant pipe for suction/delivery
504B . . . Vacuum chamber refrigerant pipe for delivery
501C, 502C, 503C, 504C . . . Heat insulating portion
D . . . Drain
EV1 . . . First electronic expansion valve
EV2 . . . Second electronic expansion valve
EV3 . . . Third electronic expansion valve
P1 . . . Pressure sensor
PSW . . . Pressure switch
SM1 . . . First stepping motor
SM2 . . . Second stepping motor
SM3 . . . Third stepping motor
T1 . . . First temperature sensor
T2 . . . Second temperature sensor
T3 . . . Third temperature sensor
T4 . . . Fourth temperature sensor
T5-1~T5-4 . . . Refrigerant temperature sensor for lower electrode refrigerant pipe
T6 . . . Refrigerant temperature sensor for vacuum chamber refrigerant pipe
T7 . . . Refrigerant temperature sensor for upper electrode refrigerant pipe
V1~V8 . . . Valve
W . . . Work.

The invention claimed is:

1. A plasma treatment device for performing plasma treatment to etch a sample, comprising:
a vacuum chamber;
an upper electrode;
a lower electrode;
heat insulating portions for the vacuum chamber; and
a chiller apparatus comprising:
a cold refrigerating cycle for cooling;
a hot refrigerant cycle for heating;
a heating device for heating;
a shared evaporator for exchanging heat between the cold refrigerating cycle and the hot refrigerant cycle;
refrigerant pipes for communicating between the hot refrigerating cycle and the plasma treatment device; and
a control device for controlling a refrigerant flow rate in the hot refrigerant cycle, wherein:
the vacuum chamber comprises:
the lower electrode serving as a table for the sample and having lower electrode refrigerant pipes attached to a table surface facing opposite to a surface of the sample;
the upper electrode having a lid part and an upper electrode refrigerant pipe;
temperature sensors; and
a vacuum chamber refrigerant pipe attached to a wall of the vacuum chamber, each of the upper electrode refrigerant pipe, the lower electrode refrigerant pipes and the vacuum chamber refrigerant pipe having a refrigerant flow path that communicates with the hot refrigerant cycle;
a temperature sensor for the lower electrode outputs a refrigerant temperature of the lower electrode refrigerant pipes;
a temperature sensor for the upper electrode outputs a refrigerant temperature of the upper electrode refrigerant pipe;
a temperature sensor for the vacuum chamber refrigerant pipe outputs a refrigerant temperature of the vacuum chamber refrigerant pipe;
the hot refrigerant cycle for any one of the upper electrode refrigerant pipe, the lower electrode refrigerant pipes and the vacuum chamber refrigerant pipe comprises:
temperature sensors for a refrigerant suction-side that output refrigerant return temperatures of the refrigerant pipes; and
temperature sensors for a refrigerant delivery-side that output refrigerant delivery temperatures of the refrigerant pipes;
the control device comprises a PID arithmetic operation unit which generates a control signal for controlling the heating of the heating device in accordance with a temperature difference between a prescribed setting temperature and a work temperature based on any one of a first, a second and/or a third feedback control;
to perform the first feedback control, the control device generates the control signal based on an output of the temperature sensor for the lower electrode refrigerant pipes so that a refrigerant temperature of the lower electrode refrigerant pipes becomes the setting temperature, and transmits the control signal to the heating device;
to perform the second feedback control, the control device generates the control signal based on an output of the temperature sensor for the lower electrode refrigerant pipes, an output of the temperature sensor for the upper electrode refrigerant pipe, and an output of the temperature sensor for the vacuum chamber refrigerant pipe so that a refrigerant return temperature of the refrigerant pipes becomes the setting temperature; and
to perform the third feedback control, the control device generates the control signal based on an output of the temperature sensor for the lower electrode refrigerant pipes, an output of the temperature sensor for the upper electrode refrigerant pipe and an output of the temperature sensor for the vacuum chamber refrigerant pipe so that a refrigerant delivery temperature of the refrigerant pipes becomes the setting temperature.

2. The plasma treatment device according to claim 1, wherein the sample is a flat panel display of a glass substrate system.

3. The plasma treatment device according to claim 1, wherein the control device calculates an amount of thermal load indicated by a degree of heating based on the first feedback control, the second feedback control or the third feedback control, and reflects thermal load information onto a rotational speed of an electric compressor of the cold refrigerating cycle to perform a feedforward control.

4. The plasma treatment device according to claim 1, wherein the control device is configured to perform a cascade control which allows the first feedback control, the second feedback control or the third feedback control to be set and performed independently or to be set and performed selectively in combination.

\* \* \* \* \*